United States Patent [19]

Jenkinson

[11] 4,068,645

[45] Jan. 17, 1978

[54] ALUMINUM-SILICON ALLOYS, CYLINDER BLOCKS AND BORES, AND METHOD OF MAKING SAME

[75] Inventor: David Charles Jenkinson, Sidmouth, Australia

[73] Assignee: Comalco Aluminium (Bell Bay) Limited, Bell Bay, Australia

[21] Appl. No.: 617,438

[22] Filed: Sept. 29, 1975

Related U.S. Application Data

[63] Continuation-in-part of Ser. No. 459,261, April 9, 1975, abandoned.

[30] Foreign Application Priority Data

Apr. 16, 1973  Australia .............................. 2998/73

[51] Int. Cl.² ................................................ F02F 1/18

[52] U.S. Cl. ............................... 123/193 C; 29/527.6; 75/142; 75/143; 75/147; 75/148; 92/169; 123/193 CH; 123/193 CP; 148/32

[58] Field of Search ................. 75/148, 135, 147, 142, 75/143; 92/169, 171; 148/32, 32.5; 123/193 C, 193 CH, 193 CP; 29/23, 527.6

[56] References Cited

U.S. PATENT DOCUMENTS

| 3,124,452 | 3/1964 | Kraft ....................................... 75/135 |
| 3,727,524 | 4/1973 | Nishiyama et al. .................... 75/148 |

Primary Examiner—R. Dean
Attorney, Agent, or Firm—Pollock, Vande Sande & Priddy

[57] ABSTRACT

Aluminum silicon alloys exhibiting microstructures characterized by the absence of any primary aluminum or primary silicon phase and a high volume fraction of finely dispersed eutectic silicon suitable for use as wear-resistant surfaces.

23 Claims, 8 Drawing Figures

ALUMINUM-SILICON ALLOYS, CYLINDER BLOCKS AND BORES, AND METHOD OF MAKING SAME

This application is a continuation-in-part of my application Ser. No. 459,261 filed Apr. 9, 1975, abandoned.

This invention relates to aluminum silicon alloys which have controlled microstructures and which are suitable for use as wear-resistant surfaces, for example as cylinder block material in internal combustion engines, and as bearings and cylinder piston combinations generally. The alloys are characterized especially by the compatibility of their working surfaces with engine components, such as pistons, in contact with them.

The use of aluminum alloys such as aluminum silicon alloys for internal combustion engines, is not new. Although a satisfactory degree of compatibility between two aluminum surfaces has never been achieved, various ways of approaching the problem have been devised while still retaining the overall concept of an aluminum engine. These ways include the provision of iron liners, and the plating of piston and/or cylinder bore surfaces with harder metals such as iron or chromium. More recently technology has been developed which utilizes unplated hyper-eutectic aluminum-silicon alloy bore surfaces which, however, need to be subjected to a specialized finishing procedure and require the use of iron-plated pistons.

All these approaches involve some specialized and elaborate forms of surface preparation of either piston, cylinder or both, over and above the initial manufacturing and machining processes.

The use of aluminum has been based on the selection of alloys which are suitable as regards castability, good thermal conductivity and light weight. In general the conventional aluminum silicon alloys used range from hypo-eutectic (below about 12 wt. % Si) to hyper-eutective (up to about 20% Si) compositions. These alloys contain significant amounts of the primary aluminum phase and/or of primary silicon particles.

We have found that by appropriate choice of alloy composition and casting conditions a wholly eutectic structure can be formed in aluminum silicon alloys at silicon contents above the equilibrium eutectic composition. By control of the solidification conditions the formation of large angular idiomorphs of primary silicon and of primary dendrites of aluminum is prevented. In their place small fibrous fully modified particles of eutectic silicon are produced thereby giving rise to what might be regarded as a very special alloy microstructure which is characterized by an unusually high volume fraction of finely dispersed silicon in the absence of any primary phases, aluminum or silicon.

In microstructures produced by existing processes, particles of either or both primary aluminum or silicon are invariably present and both these phases usually exist as large scattered areas. On contact with an unplated aluminum piston alloy surface the aluminum phase will cause seizing and the large angular silicon particles may score the piston surface and may even chip. Existing technology therefore, requires that the working faces of pistons be plated, usually with iron or chromium, or be protected in some other way. Alternatively, in the case of unplated pistons, compatibility is provided by the use of cast iron sleeves or by chromium plating the cylinder bores.

Our microstructures produced by controlled solidification at the working surfaces of cylinder blocks or liners are most useful in internal combustion engines used for automotive purposes, and in various small implements and propulsive units. The alloys' unique microstructure eliminates any need for piston or bore plating with a hard metal, such as iron or chromium. In this respect a distinct and significant improvement over aluminum silicon alloys now used in internal combustion engines has been achieved.

In the present invention no complex piston plating process is required. Standard chrome plated piston rings can be successfully used. The use of chrome plated compression rings of a suitable barrel shape and of chrome plated multi-piece oil rings has been found particularly satisfactory. Such standard piston rings in combination with our alloy produce an overall result similar to that achieved with the more complex technology of a multi-step piston plating procedure.

A novel characteristic of the present invention is the much improved casting qualities obtainable in eutectic alloys due to the absence of any mushy stage during the solidification of these alloys. In the alloys of the invention this desirable feature is extended to what are normally hyper-eutectic alloys.

In one aspect the invention comprises aluminum silicon alloys possessing the previously described special microstructures characterized by an unusually high volume fraction of finely dispersed eutectic silicon and no primary aluminum or silicon phases.

It is preferable to select an alloy composition such that the eutectic composition is modified upwards from the normal value of about 12.7 wt. % Si, as shown in Al-Si phase diagrams. Fully eutectic microstructures may be achieved with compositions containing up to 18 wt. % Si, and by the selection of appropriate solidification conditions. Further, the addition of up to 0.10 wt. % strontium enlarges the range of solidification conditions appropriate to the production of said microstructure.

The Brinell hardness of the alloy may be varied between 70–150 by including varying amounts of magnesium up to 4 wt. % max.

Essentially the chemical compositions of the alloys are as shown below:

| Element | wt. % |
|---------|-------|
| Si | 13 – 18 |
| Mg | 0 – 4 |
| Fe | 0 – 1.5 |
| Sr | 0 – 0.10 |
| Na | 0 – 0.10 |
| Al | Remainder, apart from impurities. |

Strontium and/or sodium are the preferred elements for modification of the microstructure, but other alkali or alkaline earth metals may also be suitable for this purpose.

Copper may be used up to 4 wt. % in addition to or as a full or partial replacement for magnesium.

The invention accordingly also provides an alloy of the following composition:

| Element | wt. % |
|---------|-------|
| Si | 13 – 18 |
| Mg | 0 – 4 |
| Cu | 0 – 4 |
| Fe | 0 – 1.5 |

-continued

| Element | wt. % |
|---|---|
| Sr | 0 – 0.10 |
| Na | 0 – 0.10 |
| Al | Remainder, apart from impurities. |

The desired microstructures in the alloys are produced by careful selection of the right combination of four parameters — silicon content, modifier content, growth rate during solidification (R) and temperature gradient (G). By growth rate is meant the growth rate of the solid phases during solidification of the casting, and this is commonly expressed in microns/second such as 200 to 2,000 microns/second. By temperature gradient is meant the temperature gradient existing in the liquid at the solid/liquid interface during solidification, and this is expressed in °C/cm such as 10°–150° C/cm.

The modified microstructure can be produced, notwithstanding wide variation of any of the above parameters, provided variation of one or more of the other parameters is consistent with the attainment of the said modified microstructure, for example, tectic phase field while a decrease in temperature gradient reduces it.

The microstructures shown in FIGS. 1 to 5, together with the graph in FIG. 8, are the essence of the invention. Notable is the fine, uniform, structure characterizing FIGS. 2–5. In contrast, the presence of primary phases is clearly evident in FIG. 7.

When comparing applicant's microstructures (FIGS. 1 to 5) both for the 14 wt. % Si and 17 wt. % Si alloys (with or without Sr additions) will chill cast alloys containing 14 wt. % Si (with or without Sr additions) the differences are very obvious. Applicant's structures are free from primary Si and primary Al dendrites, exhibiting only fully modified eutectic. Primary phases are present in the microstructures of alloys produced by conventional chill casting (see FIGS. 6 and 7). Since these primary phases are already very evident in the 14 wt. % Si alloy, a much greater proportion of them could be expected at higher Si contents with resultant deterioration in mechanical properties and casting behavior. Also the particles of eutectic silicon are of small size, i.e., their size may be less than 10 microns, or less than 1 micron, and as small as approximately 0.1 micron

| 14 wt. % Si, | 0.0 wt. % Sr, | G = 100° C/cm, | R = 700–2000 microns/sec |
|---|---|---|---|
| | 0.005 wt. % Sr, | G = 100° C/cm, | R = 250–2000 microns/sec |
| | 0.01 wt. % Sr, | G = 100° C/cm, | R = 200–2000 microns/sec |
| 17 wt. % Si | 0.0 wt. % Sr, | G = 100° C/cm, | R = 1000–2000 microns/sec |
| | 0.005 wt. % Sr, | G = 100° C/cm, | R = 200–2000 microns/sec |
| | 0.01 wt. % Sr, | G = 100° C/cm, | R = 200–2000 microns/sec |

Similarly, an increase in R outside these ranges can be tolerated if a suitable increase in G occurs simultaneously.

The invention will be further disclosed with reference to the accompanying figures in which.

Figure 7:
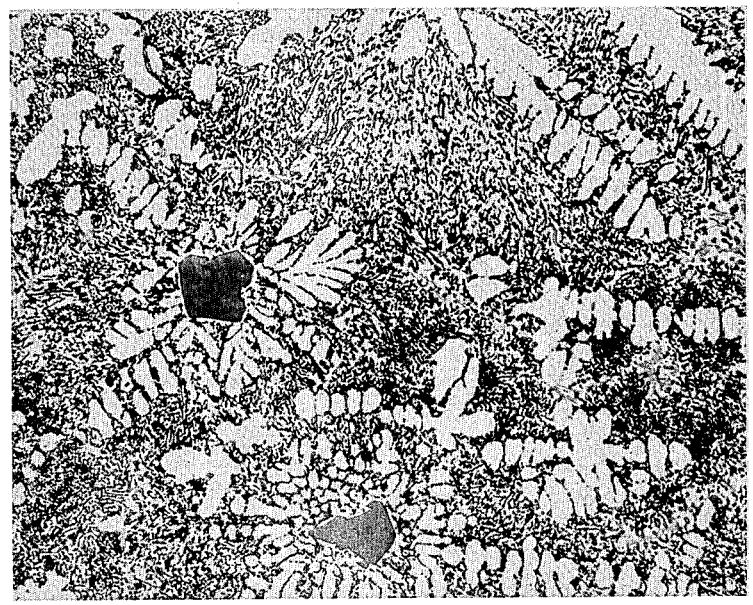
Figure 8:
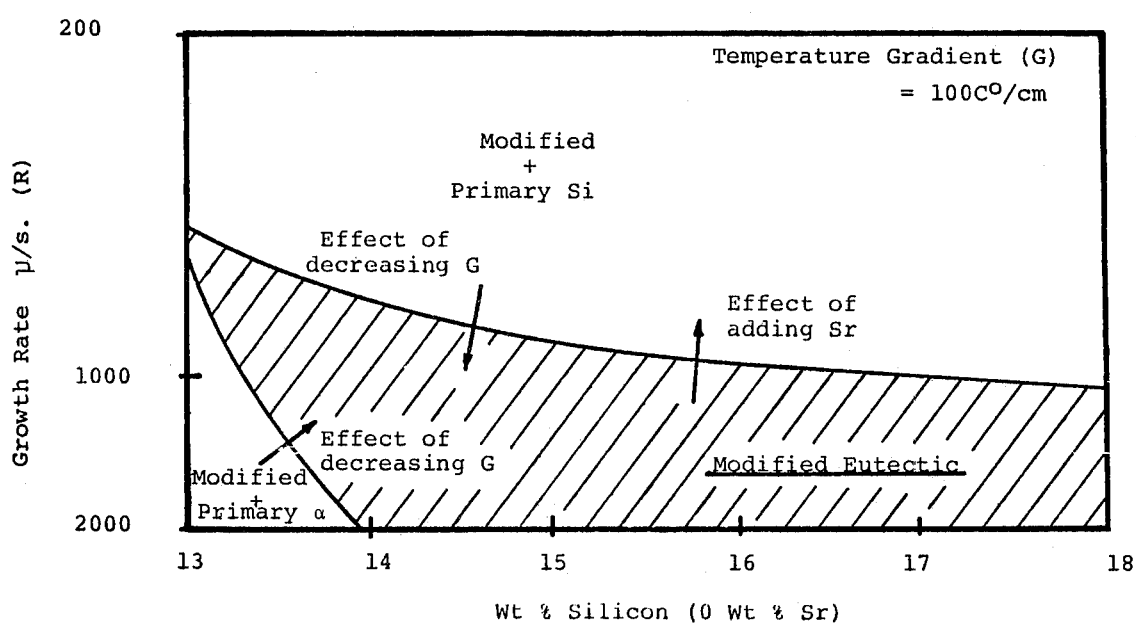

FIG. 7 is a micrograph (× 650) of a chill cast Al—Si alloy containing 14 wt. % Si and 0.04 wt. % Sr; and FIG. 8 is a graph showing growth rates (R) required to produce wholly modified microstructures according to the invention in alloys containing about 13 to about 18% Si. An increase in temperature gradient, and/or the addition of trace elements, enlarges the wholly euin diameter.

EXAMPLE

A typical alloy according to the invention was tested in the form of cylinder liners, approximately 142 mm long and having an internal diameter of 76 mm. in a Renault R16 in-line four cylinder water cooled automobile engine.

The alloy contained 14.4 wt.% silicon, from 0.017–0.023 wt.% strontium and from 0.45–0.52 wt.% magnesium.

Figure 1:
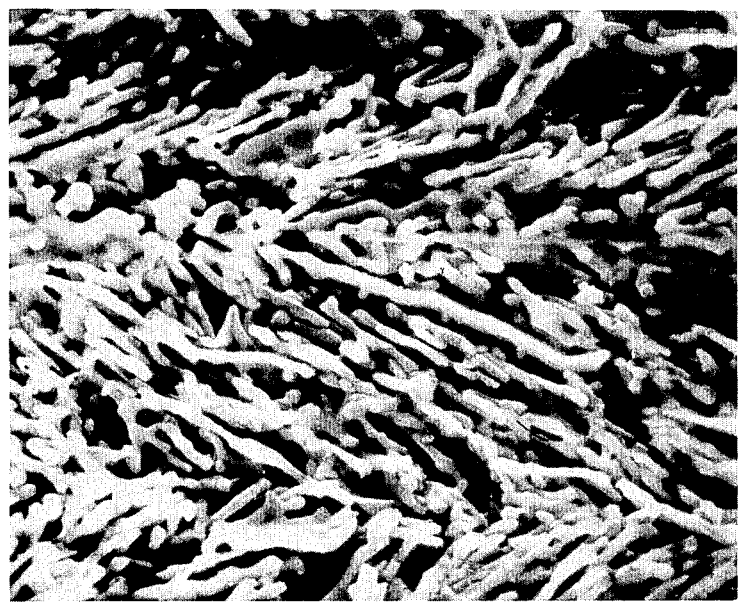
FIG. 1 is a scanning electromicrograph (× 3000) of an alloy according to the invention containing 14 wt. % Si and 0.01 wt. % Sr, (G = 100° C/cm and R = 200 microns/sec) which demonstrates the fibrous unaligned "fir tree" nature of the eutectic silicon phase.
Figure 2:
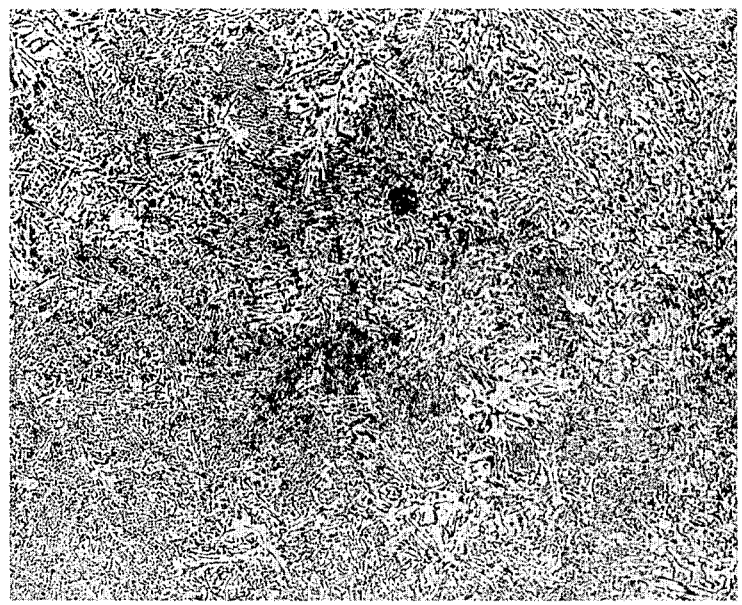
FIG. 2 is a typical micrograph (× 650) of an alloy according to the invention containing 14 wt. % Si and no trace elements (G = 100° C/cm R = 700 microns/sec)
Figure 3:
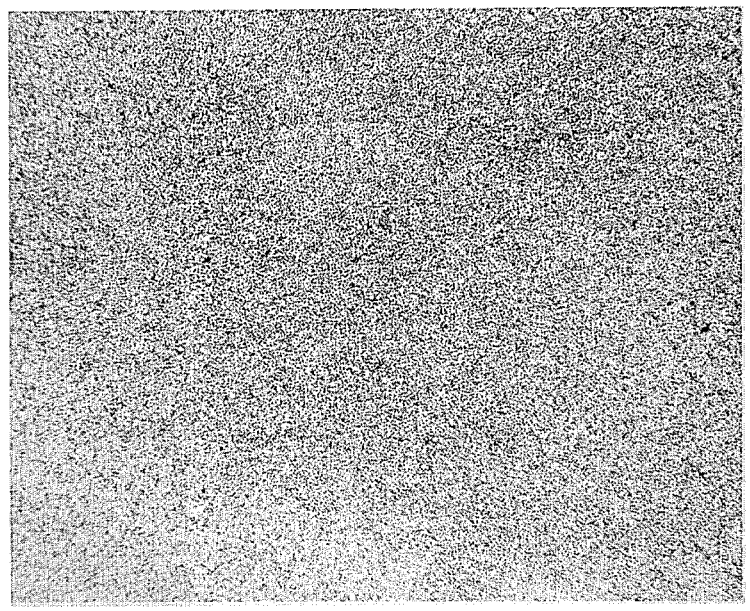
FIG. 3 is a typical micrograph (33 650) of an alloy according to the invention containing 14 wt. % Si and 0.005 wt. % Sr (G = 100° C/cm R = 800 microns/sec)
Figure 4:
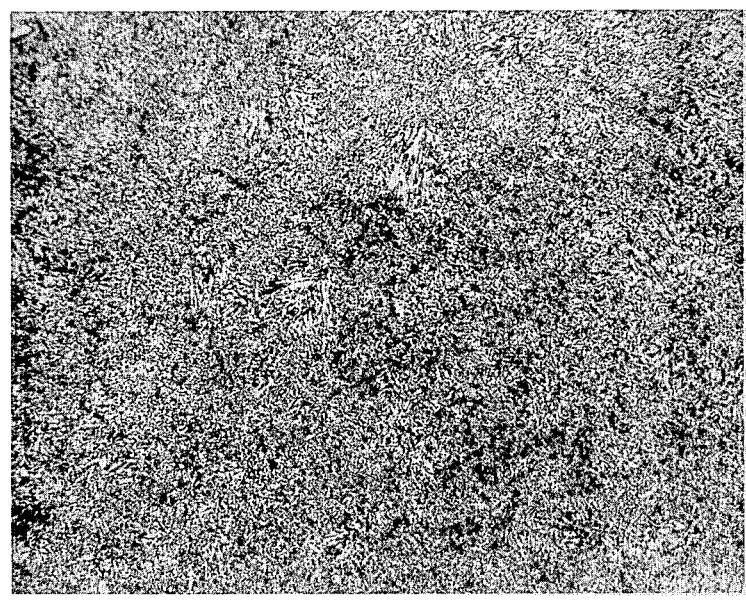
FIG. 4 is a typical micrograph (× 650) of an alloy according to the invention containing 17 wt. % Si and no trace elements (G = 100° C/cm R = 1800 microns sec)
Figure 5:
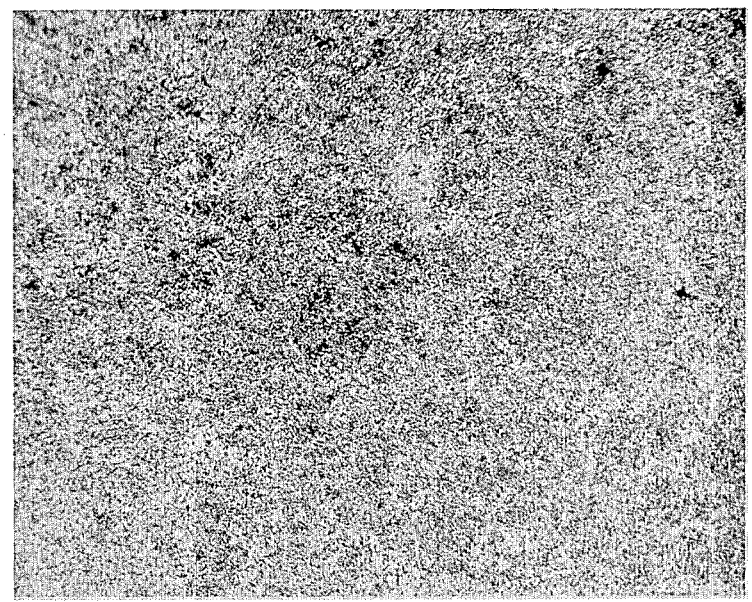
FIG. 5 is a typical micrograph (× 650) according to the invention containing 17 wt. % Si and 0.01 wt. % Sr (G = 100° C/cm R = 1600 microns/sec)
Figure 6:
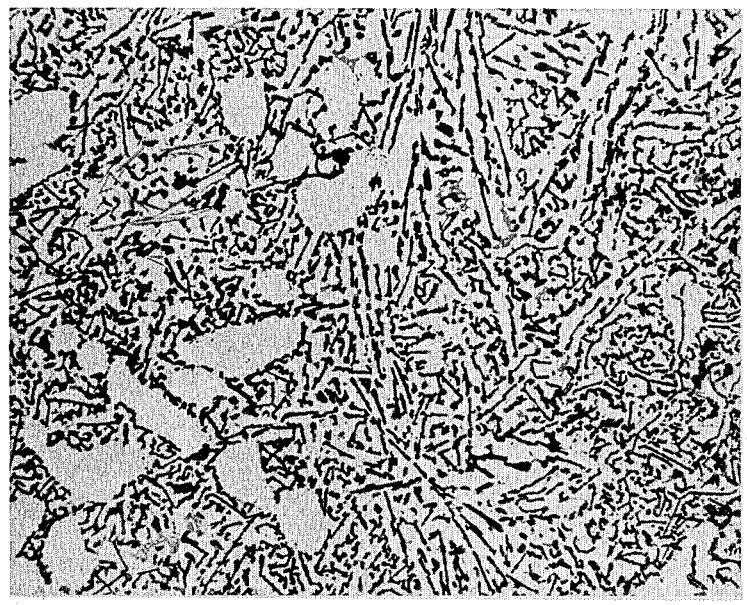
FIG. 6 is a micrograph (× 650) of a chill cast Al-Si alloy containing 14 wt. % Si and no trace elements.

The cylinder liner castings were produced in a directonal solidification furnace with a growth rate selected at about 300 microns/sec. and a temperature gradient of about 150° C/cm. The resultant modified silicon particles were approximately 0.1 micron in diameter, small enough to eliminate any need for any elaborate finishing procedure. The general microstructure corresponded to that shown in FIG. 1.

The hardness of the liners range from 118–134 Brinell.

The only treatment of the bores of the liners after machining was the removal of the aluminum smear due to machining in a weak warm solution of caustic soda followed by a simple rinse.

In accordance with an engine manufacturer's recommendation three piece chrome plated oil rings, and chrome plated "barrelled" compression rings were used in the tests.

The test conditions and compression values obtained after testing are shown in the Table below for a 61 hour test run. Also shown for comparison are the results obtained using standard cast iron liners in the same engine.

TABLE (Compression Values)

| | (1) New Engine | (2) After Running-in | (3) After Load Tests | (4) After Endurance Tests |
|---|---|---|---|---|
| Standard Cast Iron | 180,180 p.s.i. (1,240 MPa) | 188,195 p.s.i. (1.295,1.344MPa) | 195,190 p.s.i. (1.344,1.309MPa) | 190,180 p.s.i. (1.309,1.240MPa) |
| Aluminium Alloy Liners | 180,180 p.s.i. (1.240 MPa) | 185,185 p.s.i. (1.275 MPa) | 180,180 p.s.i. (1.240 MPa) | 185,185 p.s.i. (1.275 MPa) |

Legend:
(1) After warming-up for 15 minutes at idling speeds
(2) After running for 3 hours at speeds of up to 2200 R.P.M.
(3) After running under varying loads up to maximum speed and with wide open throttle for approximately 2 hours.
(4) After further 54.75 hours' running (including several warm-up periods from cold) at wide open throttle and varying loads to adjust speed between 1500 and 5250 R.P.M.

At the conclusion of the test, alloy bore wear was found to be negligible, and when compared with a standard engine, oil and fuel consumption were found to be slightly lower, and power output slightly higher.

I claim:

1. An aluminum-silicon alloy suitable for wearing surfaces consisting essentially of aluminum and an amount of silicon which is in excess of 12.7% and up to 18%, said alloy having a microstructure which is free of primary aluminum and silicon phases and is composed of fibrous, fully modified particles of eutectic silicon having a particle size of less than 10 microns.

2. Alloy according to claim 1 wherein said particles of eutectic silicon have a particle size of less than 1 micron.

3. Alloy according to claim 1 wherein said particles of eutectic silicon have a particle size of approximately 0.1 micron.

4. Alloy according to claim 1 having a hardness in the range of 70-150, Brinell.

5. Alloy according to claim 1 which includes 0-4% magnesium, 0-1.5% iron, 0-0.10% strontium, 0-0.10% sodium, the remainder, apart from impurities, being aluminum.

6. Alloy according to claim 1 which includes 0-4% copper, 0-4% magnesium, 0-1.5% iron, 0-0.10% strontium, 0-0.10% sodium, the remainder, apart from impurities, being aluminum.

7. A cylinder block having a bore, said bore having as a wearing surface thereof the alloy of claim 1.

8. A cylinder block according to claim 7 wherein said bore is fitted with a piston having an aluminum alloy working surface.

9. A cylinder block according to claim 7 wherein said bore is fitted with a piston having an aluminum alloy working surface, and said bore and said working surface being free of iron plating and chromium plating.

10. A cylinder block according to claim 9 wherein said piston is fitted with a chromium plated oil ring.

11. A cylinder block according to claim 9 wherein said piston is fitted with a chromium plated compression ring.

12. A cylinder block of an internal combustion engine, said cylinder block having a bore, said bore having as a wearing surface thereof the alloy of claim 1, said bore being fitted with a piston having an aluminum alloy working surface.

13. A cylinder block according to claim 12 wherein said bore and working surface are free of iron plating and chromium plating and said piston is fitted with chromium plated oil and compression rings.

14. A method of producing aluminum-silicon alloys comprising forming a molten alloy consisting essentially of aluminum and an amount of silicon which is in excess of 12.7% and up to 18%, solidifying said molten alloy while controlling the growth rate of the solid phase during solidification at 200 or more microns per second and controlling the temperature gradient existing in the liquid phase at the solid/liquid interface during solidification at 100° C/cm to produce in the solidified alloy a microstructure which is free of primary aluminum and silicon phases and is composed of fibrous, fully modified particles of eutectic silicon having a particle size of less than 10 microns.

15. A method of producing aluminum-silicon alloys comprising forming a molten alloy consisting essentially of aluminum, an amount of silicon which is in excess of 12.7% and up to 18%, and up to 0.1% strontium, and solidifying said alloy under conditions of growth rate and temperature gradient which are sufficient to produce a microstructure in the solidified alloy which is free of primary aluminum and silicon phases and is composed of fibrous, fully modified particles of eutectic silicon having a particle size of less than 10 microns, said growth rate being 200 or more microns per second, said temperature gradient being 100° C/cm, and said amount of strontium being sufficient, in combination with said silicon content, growth rate and temperature gradient, to assist in the production of said microstructure.

16. A method of producing aluminum-silicon alloy comprising forming a molten alloy consisting essentially of aluminum and about 13 to about 18% by weight of silicon, and solidifying said molten alloy in a directional solidification furnace under conditions of growth rate and temperature gradient which are sufficient to produce a microstructure in the solidified alloy which is free of primary aluminum and silicon phases and is composed of fibrous, fully modified particles of eutectic silicon having a particle size of less than 10 microns, said growth rate being controlled during solidification in the range of 200 to 2,000 microns per second and said temperature gradient in the liquid phase at the solid/liquid interface being controlled during solidification in the range of 10° to 150° C/cm.

17. A method according to claim 16, wherein the alloy is solidified in the form of a cylinder sleeve for an internal combustion engine.

18. Method according to claim 17 wherein the bore of the resultant sleeve is machined to the desired diameter and aluminum smear is removed from said bore with a weak warm solution of caustic soda followed by rinsing.

19. A method of producing aluminum-silicon alloy comprising forming a molten alloy consisting essentially of aluminum, about 13 to about 18% by weight of silicon, and up to 0.1% strontium, and solidifying said alloy in a directional solidification furnace under conditions of growth rate and temperature gradient which are sufficient to produce a microstructure in the solidified alloy which is free of primary aluminum and silicon phases and is composed of fibrous, fully modified particles of eutectic silicon having a particle size of less than 10 microns, said growth rate being controlled during solidification in the range of 200 to 2,000 microns per second and said temperature gradient in the liquid phase at the solid/liquid interface being controlled during solidification in the range of 10° to 150° C/cm.

20. A method according to claim 19, wherein the alloy is solidified in the form of a cylinder sleeve for an internal combustion engine.

21. Method according to claim 20 wherein the bore of the resultant sleeve is machined to the desired diameter and aluminum smear is removed from said bore with a weak warm solution of caustic soda followed by rinsing.

22. A method according to claim 16 wherein said temperature gradient is about 100° C/cm and said growth rate is controlled in that portion of the shaded sector of the graph of FIG. 8 which corresponds to the silicon content of the alloy.

23. A method according to claim 19 wherein said temperature gradient is about 100° C/cm and the growth rate is controlled in that portion of the shaded sector of the graph of FIG. 8 which corresponds to the silicon content of the alloy.

* * * * *